(12) United States Patent
Kim et al.

(10) Patent No.: US 9,711,675 B2
(45) Date of Patent: Jul. 18, 2017

(54) SENSING PIXEL AND IMAGE SENSOR INCLUDING THE SAME

(71) Applicant: Samsung Electronics Co., Ltd., Suwon-si, Gyeonggi-do (KR)

(72) Inventors: Seoung-hyun Kim, Hwaseong-si (KR); Won-joo Kim, Hwaseong-si (KR); Young-gu Jin, Osan-si (KR)

(73) Assignee: Samsung Electronics Co., Ltd. (KR)

( * ) Notice: Subject to any disclaimer, the term of this patent is extended or adjusted under 35 U.S.C. 154(b) by 277 days.

(21) Appl. No.: 14/533,216

(22) Filed: Nov. 5, 2014

(65) Prior Publication Data

US 2015/0122973 A1 May 7, 2015

(30) Foreign Application Priority Data

Nov. 6, 2013 (KR) .................. 10-2013-0134359

(51) Int. Cl.
*H01L 31/113* (2006.01)
*H01L 27/146* (2006.01)
*H01L 31/0352* (2006.01)
*H04N 5/378* (2011.01)

(52) U.S. Cl.
CPC ...... *H01L 31/1136* (2013.01); *H01L 27/1461* (2013.01); *H01L 27/14603* (2013.01); *H01L 27/14612* (2013.01); *H01L 27/1464* (2013.01)

(58) Field of Classification Search
CPC ............... H01L 31/1136; H01L 31/113; H01L 31/035281; H01L 31/0352; H01L 27/14612; H01L 27/146; H01L 27/14603; H01L 27/1464; H01L 27/1461; H01L 27/14643; H04N 5/378
See application file for complete search history.

(56) References Cited

U.S. PATENT DOCUMENTS

| | | | |
|---|---|---|---|
| 5,587,596 A * | 12/1996 | Chi | ................... H01L 27/14656 257/223 |
| 5,808,677 A * | 9/1998 | Yonemoto | ............ H04N 3/1512 250/208.1 |
| 7,220,959 B2 | 5/2007 | Nishimura | |
| 7,276,748 B2 * | 10/2007 | Ellis-Monaghan | ......................... H01L 27/14603 257/291 |
| 7,531,857 B2 | 5/2009 | Park | |
| 7,535,073 B2 | 5/2009 | Ezaki | |
| 7,579,665 B2 | 8/2009 | Yokoyama et al. | |
| 7,667,178 B2 | 2/2010 | Bae et al. | |
| 8,089,109 B2 | 1/2012 | Shinomiya | |

(Continued)

FOREIGN PATENT DOCUMENTS

| | | |
|---|---|---|
| JP | 2004-221250 | 8/2004 |
| JP | 2006-245264 | 9/2006 |

(Continued)

*Primary Examiner* — John Lee
(74) *Attorney, Agent, or Firm* — Myers Bigel, P.A.

(57) ABSTRACT

Disclosed are a sensing pixel and an image sensor including the same. The sensing pixel includes a determination region, which includes one or more floating body transistors, and an integration region that is adjacent to a floating body region of one of the one or more floating body transistors, absorbs light to generate an electron-hole pair including an electron and a positive hole, and transfers the electron or the positive hole to the floating body region of the one floating body transistor.

20 Claims, 14 Drawing Sheets

(56) References Cited

U.S. PATENT DOCUMENTS

| | | | |
|---|---|---|---|
| 8,138,531 B2* | 3/2012 | Adkisson | H01L 27/14609 257/290 |
| 8,232,586 B2* | 7/2012 | Potok | H01L 31/113 257/290 |
| 8,253,830 B2 | 8/2012 | Endo et al. | |
| 8,637,910 B2* | 1/2014 | Koo | H01L 27/14609 257/219 |
| 9,082,368 B2* | 7/2015 | Kim | G09G 3/3696 |
| 9,118,856 B2* | 8/2015 | Kim | H04N 5/3696 |
| 9,462,199 B2* | 10/2016 | Kim | H04N 5/335 |
| 2005/0280028 A1* | 12/2005 | Fazan | G11C 11/403 257/192 |
| 2007/0001163 A1* | 1/2007 | Lee | H01L 31/028 257/19 |
| 2007/0004067 A1* | 1/2007 | Hsu | H01L 31/1136 438/29 |
| 2007/0063299 A1 | 3/2007 | Hwang | |
| 2007/0114630 A1* | 5/2007 | Kishima | G02B 6/12004 257/462 |
| 2007/0290288 A1* | 12/2007 | Hsu | H01L 31/1136 257/462 |
| 2009/0206237 A1* | 8/2009 | Shannon | H01L 29/41733 250/214 AL |
| 2009/0251581 A1* | 10/2009 | Cha | H01L 27/14609 348/308 |
| 2010/0019296 A1* | 1/2010 | Cha | B82Y 20/00 257/292 |
| 2010/0133647 A1* | 6/2010 | Kim | H01L 21/76224 257/507 |
| 2010/0224759 A1* | 9/2010 | Honjo | H01L 27/14609 250/208.1 |
| 2010/0320515 A1 | 12/2010 | Fossum et al. | |
| 2012/0088340 A1* | 4/2012 | Park | H01L 29/66757 438/166 |
| 2012/0092532 A1* | 4/2012 | Ladd | H01L 27/1463 348/241 |
| 2012/0161277 A1* | 6/2012 | Kim | H01L 21/76224 257/507 |
| 2014/0103190 A1* | 4/2014 | Lee | H01L 27/14612 250/208.1 |
| 2014/0103193 A1* | 4/2014 | Lee | H01L 27/14609 250/208.1 |
| 2014/0198183 A1* | 7/2014 | Kim | G01S 17/89 348/46 |
| 2015/0122973 A1* | 5/2015 | Kim | H01L 31/1136 250/208.1 |

FOREIGN PATENT DOCUMENTS

| | | |
|---|---|---|
| KR | 10-1994-0027205 | 10/1994 |
| KR | 1020040043723 A | 5/2004 |
| KR | 1020040059942 A | 7/2004 |
| KR | 1020060010899 A | 2/2006 |
| KR | 1020100045204 A | 5/2010 |

* cited by examiner

SENSING PIXEL AND IMAGE SENSOR INCLUDING THE SAME

CROSS-REFERENCE TO RELATED APPLICATION

This application claims priority under 35 U.S.C. §119 to Korean Patent Application No. 10-2013-0134359, filed on Nov. 6, 2013, in the Korean Intellectual Property Office, the disclosure of which is incorporated herein in its entirety by reference.

BACKGROUND

The inventive concepts relate to a sensing pixel and an image sensor including the same, and more particularly, to a sensing pixel that includes a floating body transistor and an image sensor including such sensing pixels.

An image sensor is an optical-to-electrical conversion device that senses light and generates an electrical signal in response to the sensed light. Generally, the image sensor includes a plurality of pixels that are arranged in a matrix on a semiconductor substrate. Each of the pixels may include transistors that are configured to output an electrical signal based on the amount of photocharge.

A complementary metal oxide semiconductor (CMOS) image sensor (CIS) realizes an image by using a control device that controls or processes a light signal. The control device may be manufactured using CMOS manufacturing technology. Therefore, a manufacturing process of the image sensor is simple, and a plurality of signal processing devices and the image sensor may be integrated into one semiconductor chip.

Efforts are currently underway to reduce the physical size of the sensing pixels in CMOS image sensors and to increase the resolution of the images generated by these image sensors.

SUMMARY

The inventive concepts provide an image sensor and a method of operating the same.

According to an aspect of the inventive concepts, a sensing pixel is provided that includes: a determination region that includes a floating body transistor that has a floating body region; and an integration region that is adjacent the floating body region of the floating body transistor, the integration region configured to generate electron-hole pairs that comprise an electron and a hole, and to transfer at least some of the electrons or holes to the floating body region of the floating body transistor.

The integration region may include: a first layer that comprises a semiconductor having a first conductivity type, the first layer being adjacent the floating body region of the floating body transistor; a second layer that comprises a semiconductor having a second conductivity type that is opposite the first conductivity type, the second layer being adjacent the first layer; and a third layer that comprises a semiconductor having the first conductivity type, the third layer being adjacent the second layer, where the second layer is between the first layer and the third layer.

The first layer may be electrically connected to a drain region of the floating body transistor.

The third layer may includes a first section that extends underneath the floating body region of the floating body transistor and a second section that is perpendicular to the first section, where the second section includes a nonconductive layer.

The floating body transistor may be a PMOS transistor, and the integration region may include a PNP junction. Alternatively, the floating body transistor may be an NMOS transistor, and the integration region may include a NPN junction.

The integration region may be configured to generate the electron-hole pairs in response to light having one of a first color, a second color, or a third color based on a thickness of the integration region.

The floating body transistor may comprise a first floating body transistor and the determination region may further include a second floating body transistor that has a floating body region that is configured to receive additional of the electrons or holes from the integration region.

The sensing pixel may be configured to absorb light in the integration region, change a voltage applied to a gate of the floating body transistor, and transfer at least some of the electrons or holes that are generated in the integration region to the floating body transistor.

The sensing pixel may be configured to absorb light in the integration region, change a voltage applied to a first layer of the integration region that is adjacent the floating body transistor, and transfer at least some of the electrons or holes that are generated in the integration region to the floating body transistor.

According to another aspect of the inventive concepts, there is provided an image sensor including: a sensing pixel array that includes a plurality of sensing pixels that are arranged in rows; a row decoder that is configured to generate drive signals that drive the rows of the sensing pixel array; an image processor that is configured to generate a color image from pixel signals which are output from the sensing pixel array; and a timing generation circuit that is configured to supply a timing signal and a control signal to the row decoder and the image processor, wherein each of the plurality of sensing pixels includes: a determination region that includes a floating body transistor; and an integration region that is adjacent the a floating body region of the floating body transistor, the integration region configured to generate electron-hole pairs that each comprise an electron and a hole in response to light received by the integration region and to transfer the at least some of the electrons or holes to the floating body region of the floating body transistor.

The integration region for a first of the sensing pixels may have a first thickness that is configured to pass light of a first color, the integration region for a second of the sensing pixels may have a second thickness that is configured to pass light of a second color, and the integration region for a third of the sensing pixels may have a first thickness that is configured to pass light of a first color.

The integration region for a first of the sensing pixels may include: a first semiconductor layer having a first conductivity type adjacent the floating body region of the floating body transistor; a second semiconductor layer having a second conductivity type that is opposite the first conductivity type, the second semiconductor layer being adjacent the first semiconductor layer; and a third semiconductor layer having the first conductivity type that is adjacent the second semiconductor layer.

The first layer may be electrically connected to a drain region of the floating body transistor.

A first of the sensing pixels may be configured to absorb light in the integration region, change a voltage applied to a gate of the floating body transistor, and transfer the electrons or holes that are generated in the integration region to the floating body transistor.

The floating body transistor may be a PMOS transistor, and the integration region may include a PNP junction. Alternatively, the floating body transistor may be an NMOS transistor, and the integration region may include a NPN junction.

According to another aspect of the inventive concepts, an sensing pixel for a sensing pixel array of an image sensor is provided that includes a floating body transistor that has a source region, a drain region, a gate electrode and a floating body region; and an integration region that is adjacent the floating body region of the floating body transistor, the integration region including a first semiconductor layer having a first conductivity type, a second semiconductor layer having a second conductivity type that is opposite the first conductivity type, and a third semiconductor layer having the first conductivity type, where the first semiconductor layer is closer to the floating body region than the second semiconductor layer and the third semiconductor layer, and wherein the second semiconductor layer is between the first and third semiconductor layers.

The floating body region may be a semiconductor region having the second conductivity type.

The first semiconductor layer may be electrically connected to the drain region of the floating body transistor.

The third semiconductor layer may include a non-conductive section.

The integration region may be underneath a bottom surface of the floating body region and may surround first and second sidewalls of the floating body region.

BRIEF DESCRIPTION OF THE DRAWINGS

Exemplary embodiments of the inventive concepts will be more clearly understood from the following detailed description taken in conjunction with the accompanying drawings in which.

DETAILED DESCRIPTION OF THE EMBODIMENTS

Figure 1:
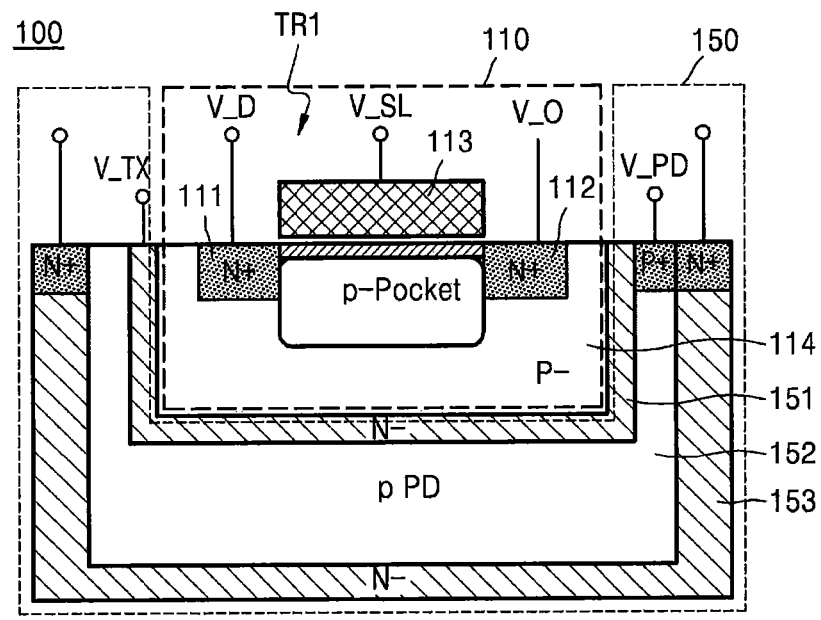
FIG. 1 is a cross-sectional view of a sensing pixel of an image sensor according to an embodiment of the inventive concepts.

Hereinafter, exemplary embodiments of the inventive concepts will be described in detail with reference to the accompanying drawings. Embodiments of the inventive concepts are provided so that this disclosure will be thorough and complete, and will fully convey the inventive concepts to one of ordinary skill in the art. The inventive concepts may be embodied in many different forms, and hence only example embodiments are illustrated in the drawings and are in this detailed description. It will be appreciated, however, that the inventive concepts are not limited to the specific example embodiments described herein, and it will be understood that the inventive concepts cover all modifications, equivalents, and replacements within the idea and technical scope of the inventive concepts. Like reference numerals refer to like elements throughout. In the drawings, the dimensions and size of each structure may be enlarged, reduced, or schematically illustrated for clarity and/or convenience of description.

The terms used in this application are not intended to limit the present embodiments. Terms of a singular form may include plural forms unless the context clearly indicates otherwise. The terms "includes," "comprises," "including," and/or "comprising" specify a property, a region, a step, a process, an element and/or a component but do not exclude other properties, regions, steps, processes, elements and/or components.

As used herein, the term "and/or" includes any and all combinations of one or more of the associated listed items. Expressions such as "at least one of," when preceding a list of elements, modify the entire list of elements.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a cross-sectional view illustrating a sensing pixel 100 of an image sensor according to an embodiment of the inventive concepts.

Referring to FIG. 1, the sensing pixel 100 includes a determination region 110 and an integration region 150.

The determination region 110 may include one or more floating body transistors TR1. Each transistor TR1 includes a drain region 111, a source region 112, a gate electrode 113, and a floating body region 114.

The integration region 150 may include a first layer 151, a second layer 152, and a third layer 153. The first layer 151 may be an N-type semiconductor layer, and may be adjacent to the floating body region 114 of the transistor TR1. The second layer 152 may be a P-type semiconductor layer, and may be adjacent to the first layer 151. The third layer 153 may be an N-type semiconductor layer, and may be adjacent to the second layer 152. The second layer 152 may be between the first layer 151 and the third layer 153.

The first layer 151 of the integration region 150 may be adjacent to a bottom surface of the determination region 110. The first to third layers 151 to 153 of the integration region 150 may be sequentially arranged under the determination region 110.

The gate electrode 113 may be formed of a transparent metal such as, for example, indium tin oxide (ITO) or polysilicon. The drain region 111, the source region 112, the first layer 151, and the third layer 153 may each comprise an N-type semiconductor. The floating body region 114 and the second layer 152 may each comprise a P-type semiconductor.

Operations in which the sensing pixel 100 senses light will now be described in detail with reference to FIG. 1 and Table 1. The sensing pixel 100 may perform four separate operations in sensing light and preparing for a subsequent light sensing operation. These operations are an integration operation, a transfer operation, a read operation and a reset operation.

TABLE 1

| Voltage (V) | V_D | V_SL | V_TX | V_PD | V_O |
| --- | --- | --- | --- | --- | --- |
| Integration | High | High | High | Floating | High |
| Transfer | High | Low | Low/Medium | Floating | High |
| Read | High | Medium | High | Floating | Floating |
| Reset | High | High | Low/Medium | GND | High |

The integration operation is an operation in which the integration region 150 collects electron-hole pairs that are generated from light that is irradiated onto the sensing pixel 100. As shown in Table 1, during the integration operation, a drain voltage V_D, a gate voltage V_SL, a source voltage V_O, and a voltage V_TX that is applied to the first layer 151 may be set to a logic high level. When light is irradiated onto the integration region 150, electron-hole pairs are generated from light having a certain range of wavelengths, where the range of wavelengths may be based on a thickness of the integration region 150. The electron-hole pairs are greatly affected by a thickness of the second layer 152 in the integration region 150.

The transfer operation is an operation that moves positive holes from the integration region 150 to the determination region 110. As shown in Table 1, during the transfer operation, the drain voltage V_D and the source voltage V_O may be set to a logic high level, the gate voltage V_SL may be set to a logic low level, and the voltage V_TX that is applied to the first layer 151 may be set to a logic low level or a logic medium level. The positive holes, which were collected in the above-described integration operation, are moved to an internal region or pocket p_Pocket of the floating body region 114 by a voltage slope.

The read operation is an operation that determines whether positive holes are present in the floating body region 114 after the transfer operation. As shown in Table 1, during the read operation, the drain voltage V_D and the voltage V_TX that is applied to the first layer 151 may be set to a logic high level, and the gate voltage V_SL may be set to a logic medium level. The read operation may determine whether positive holes are present in the pocket p_Pocket, based on a level of the source voltage V_O.

The reset operation is an operation that removes electrons or positive holes which are accumulated in the floating body region 114 and/or the integration region 150. As shown in Table 1, during the reset operation, the drain voltage V_D, the source voltage V_O, and the gate voltage V_SL may be set to a logic high level, and the voltage V_TX that is applied to the first layer 151 may be set to a logic low level or a logic medium level. Also, a voltage V_PD that is applied to the second layer 152 may be grounded. In the reset operation, the floating body region 114 and the integration region 150 are reset, and the image sensor prepares for the integration portion of the next light sensing operation.

Since the sensing pixel 100 according to an embodiment of the inventive concepts separately includes the integration region 150 for absorbing light and the determination region 110 for determining whether the light is received, the integration region 150 is formed to have a relatively broader area, thereby enhancing a fill factor and sensitivity of the sensing pixel 100 to light.

The sensing pixel 100 according to an embodiment of the inventive concepts may apply a plurality of different gate voltages V_SL to the gate electrode 113, measure the current levels between the source terminal and the drain terminal and the voltage difference between the source terminal and the drain terminal for each of the different gate voltages, and output a multi-bit signal according to the amount of light measured from the integration region 150.

Figure 2:
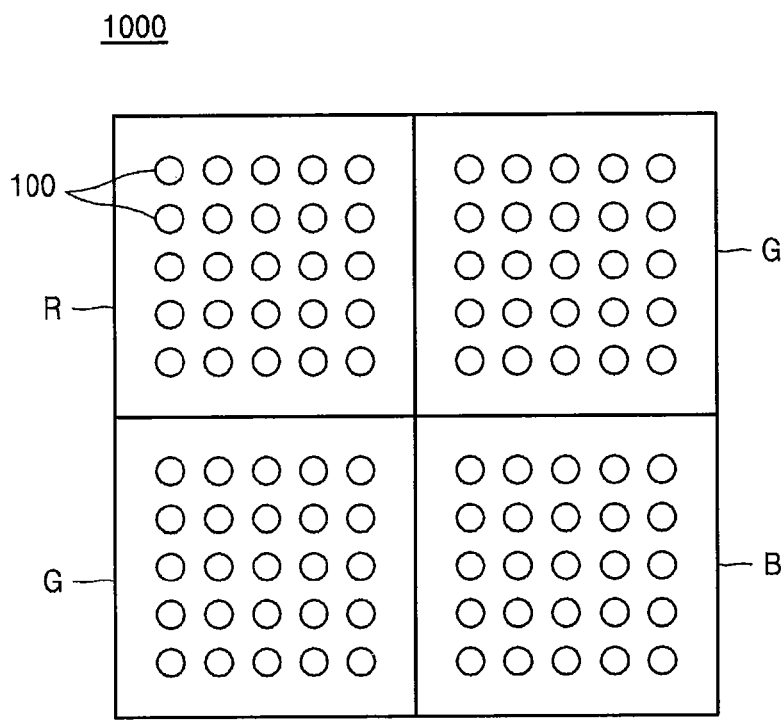
FIG. 2 is a plan view illustrating a unit sensing pixel of an image sensor according to an embodiment of the inventive concepts.

FIG. 2 is a plan view illustrating a unit sensing pixel 2000 of an image sensor according to an embodiment of the inventive concepts.

The unit sensing pixel 2000 may include one or more sub-pixels R, G and B. The R, G and B sub-pixels may each detect light having a different range of wavelengths. For example, the sub-pixels may include a red sub-pixel R that detects red light, a green sub-pixel G that detects green light, and a blue sub-pixel B that detects blue light. As shown in FIG. 2, each sub-pixel may include a plurality of sensing pixels 100.

Each sub-pixel may have one or more integration regions 150. Each integration region 150 selectively absorbs light having a wavelength within a range of wavelengths that are to be detected. A micro lens that is a condensing lens may be further provided in the integration region 150 for selecting a light wavelength. A plurality of the unit sensing pixels 2000 may be arranged in an array to form a pixel array.

The one or more floating body transistors TR1 and a wiring, which connect the floating body transistors TR1 in an array, may be formed in each of the sub-pixels R, G and B. Each of the floating body transistors TR1 provides, as digital information, an intensity of light within a selected wavelength range that is irradiated thereon.

The integration region 150 may be separate from the floating body transistor TR1. The integration region 150 may absorb light to generate electron-hole pairs, and transfer electrons or positive holes to the floating body region 114 of the floating body transistor TR1. Therefore, in the unit sensing pixel 2000, the integration region 150 is formed to have a relatively broad area, thereby enhancing the sensitivity of the sensing pixel to light.

Moreover, in the unit sensing pixel 2000, the integration region 150 may sense different light wavelengths depending on a thickness of the integration region 150. Accordingly, sub-pixels of the unit sensing pixel 2000 may select light of different wavelengths by using integration regions 150 having different thicknesses without the need for a separate color filter.

Figure 3:
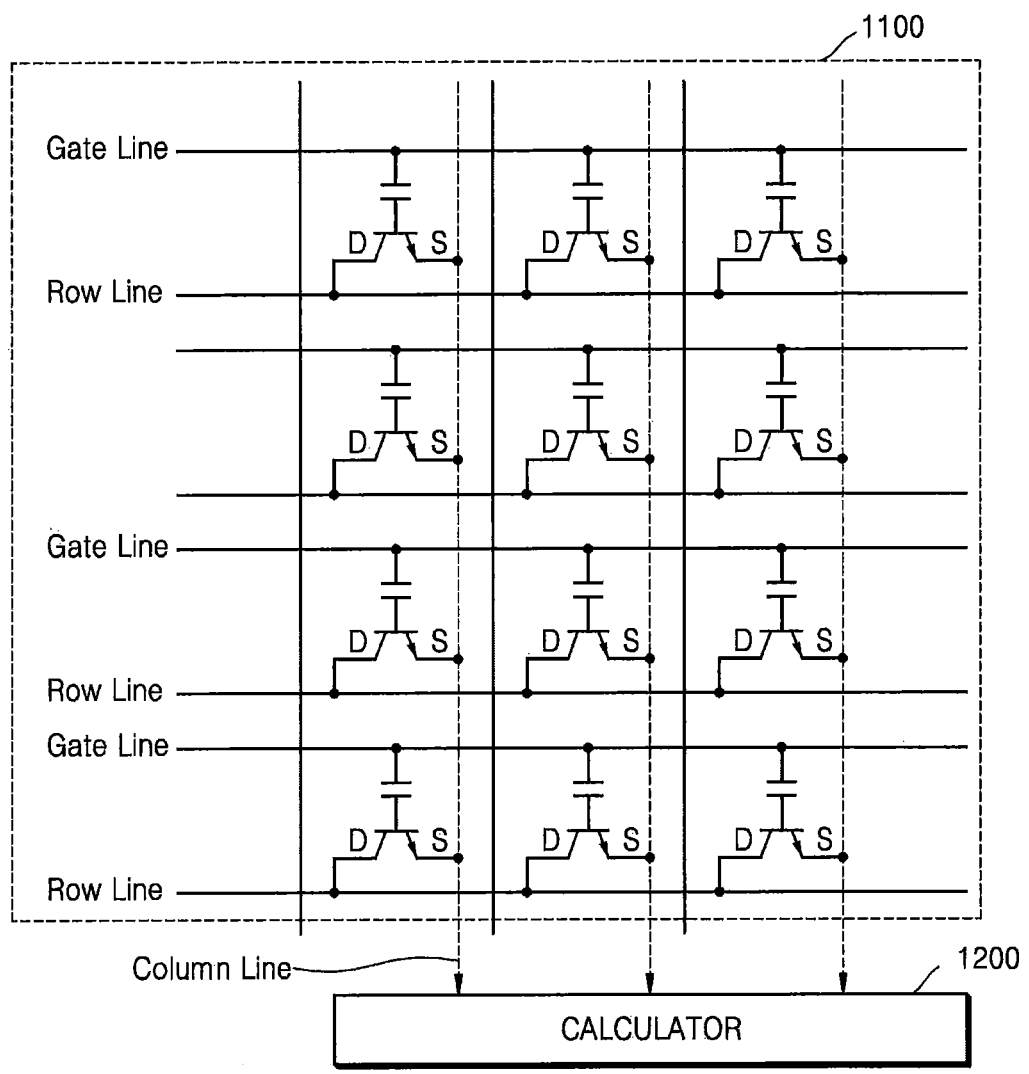
FIG. 3 is a circuit diagram illustrating a floating body transistor array of a sub-pixel sensor according to an embodiment of the inventive concepts.

FIG. 3 is a diagram illustrating a floating body transistor array 1100 of a sub-pixel sensor (e.g., an R sub-pixel) according to an embodiment of the inventive concepts.

Referring to FIG. 3, the sub-pixel includes a floating body transistor array 1100 that includes a plurality of floating body transistors TR1 that are arranged in rows and columns. Each of the sub-pixels R, G and B of FIG. 2 may include a floating body transistor array 1100.

A row line is connected to drain regions D of the floating body transistors TR1 that are included in each row, and source regions S of the floating body transistors TR1 that are included in each column are connected to a respective one of a plurality of column lines. A plurality of gate lines are disposed in parallel with the row lines. Therefore, the column line may address a cell intersecting the row line, and may also address one cell along with the gate line.

Next, a method of reading image information of each cell in the image sensor according to an embodiment of the inventive concepts will be described in detail.

First, one of the row lines is selected, and a certain voltage (for example, a voltage of about 0.1 V) is applied to the selected row line. The column lines are scanned to detect a column line through which a current flows. When the current flows in a column line, a cell in which a row line and the column line intersect each other may be read as 1, and a cell in which the current does not flow is read as 0. By repeating such an operation, the information in all of the cells included in a sub-pixel may be read.

A calculator 1200 that is connected to the column lines may calculate a numerical value that is obtained by adding the values of I that are obtained when current flows in a column line as described above and by then dividing the calculated numerical value by the total number of pixels to calculate an intensity of light in a corresponding sub-pixel region.

Figure 4:
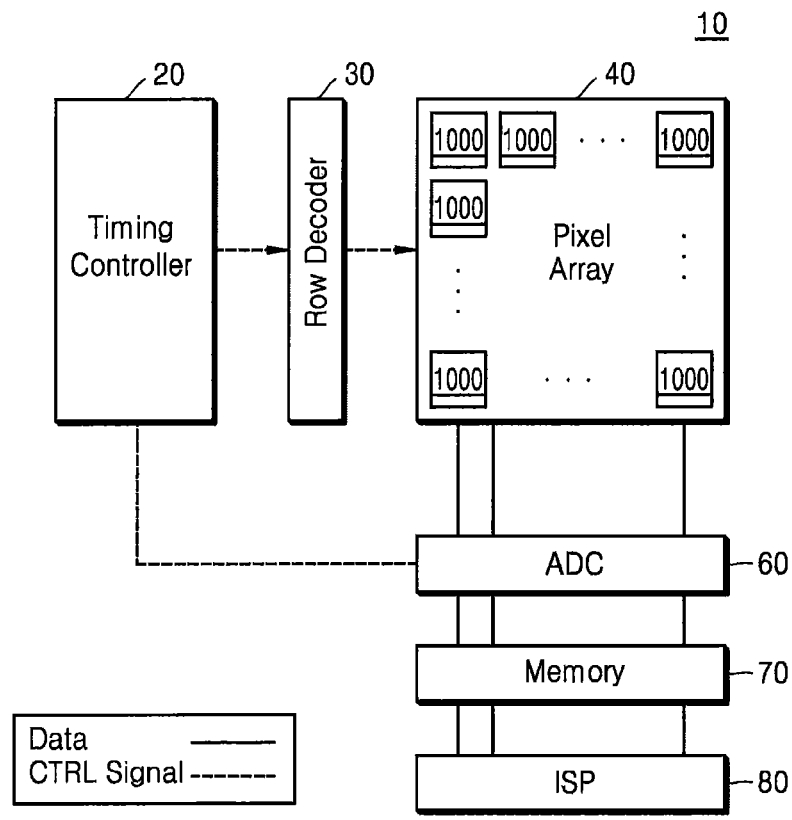
FIG. 4 is a block diagram of an image sensor according to an embodiment of the inventive concepts.

FIG. 4 is a block diagram illustrating an image sensor 10 according to an embodiment of the inventive concepts.

Referring to FIG. 4, the image sensor 10 includes a timing controller 20, a row decoder 30, a pixel array 40, an analog-to-digital converter (ADC) 60, a memory 70, and an image signal processor (ISP) 80.

The image sensor 10 generates an electrical signal in response to a light signal and then outputs the generated electrical signal. The timing controller 20 controls timing of the operations of the image sensor 10. For example, the timing controller 20 may control an amount of time during which light is collected using a gate control signal.

The row decoder 30 controls an operation (output) timing of one of a plurality of rows of the pixel array 40 in response to a row address supplied from the timing controller 20.

The pixel array 40 may include the plurality of unit sensing pixels 2000 according to an embodiment of the inventive concepts. A sensing pixel of the image sensor 10 separately includes an integration region that receives light and a determination region that determines whether light was received. The integration region may have a relatively broad area, thereby enhancing a fill factor and sensitivity of the sensing pixel to light.

The ADC 60 converts an analog signal, which is output from the pixel array 40, into a digital signal. The memory 70 may be a buffer memory or a frame memory. The memory 70 may store the digital signal in units of a frame.

The image signal processor 80 performs signal processing on a digital signal that is stored in the memory 70. Examples of the signal processing may include color interpolation, color correction, auto white balance, gamma correction, color saturation correction, formatting, bad pixel correction, and hue correction.

The structure of the ADC 60 may be changed, as appropriate, based on the type of correlated double sampling (CDS) scheme that may be used such as, for example, an analog CDS scheme, a digital CDS scheme, or a dual CDS scheme. Also, the ADC 60 may be implemented as a column ADC, in which an ADC is provided for each column of the image sensor 10, or as a single ADC in which one ADC is provided.

Figure 5:
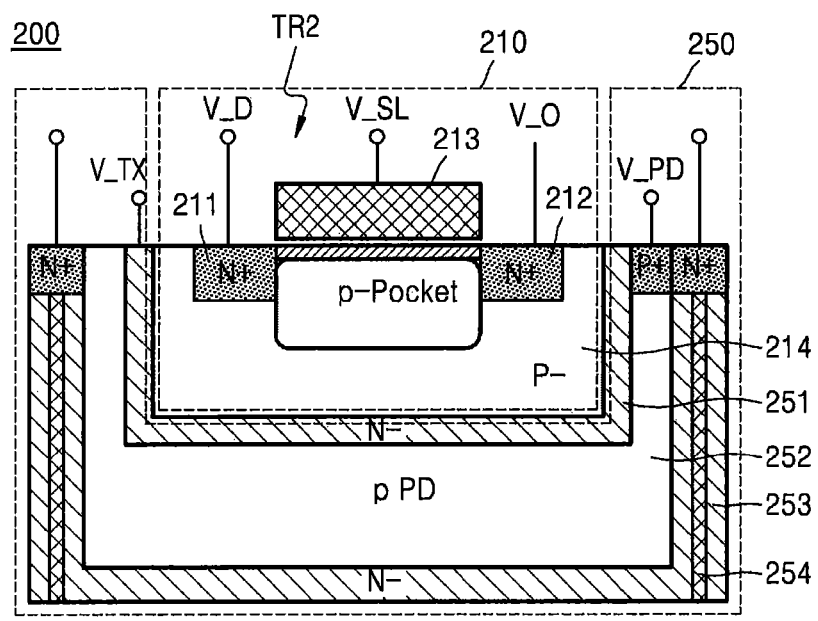
FIG. 5 is a cross-sectional view of a sensing pixel of an image sensor according to an embodiment of the inventive concepts.

FIG. 5 is a cross-sectional view illustrating a sensing pixel 200 of an image sensor according to an embodiment of the inventive concepts.

Referring to FIG. 5, the sensing pixel 200 may include a determination region 210 and an integration region 250.

The determination region 210 may include one or more floating body transistors TR2 that include a drain region 211, a source region 212, a gate electrode 213, and a floating body region 214.

The integration region 250 may include a first layer 251, a second layer 252, and a third layer 253. The first and second layers 251 and 252 may be configured similar to the first and second layers 151 and 152 of FIG. 1, respectively.

The third layer 253 may include a nonconductive layer 254. For example, the third layer 253 may include a nonconductive layer 254 such as a front deep trench isolation (FDTI) or back deep trench isolation (BDTI) layer. The nonconductive layer 254 can reduce or prevent crosstalk between pixels. Also, the third layer 253 may include a p-well and an n-well, which may also reduce or prevent crosstalk between pixels.

Figure 6:
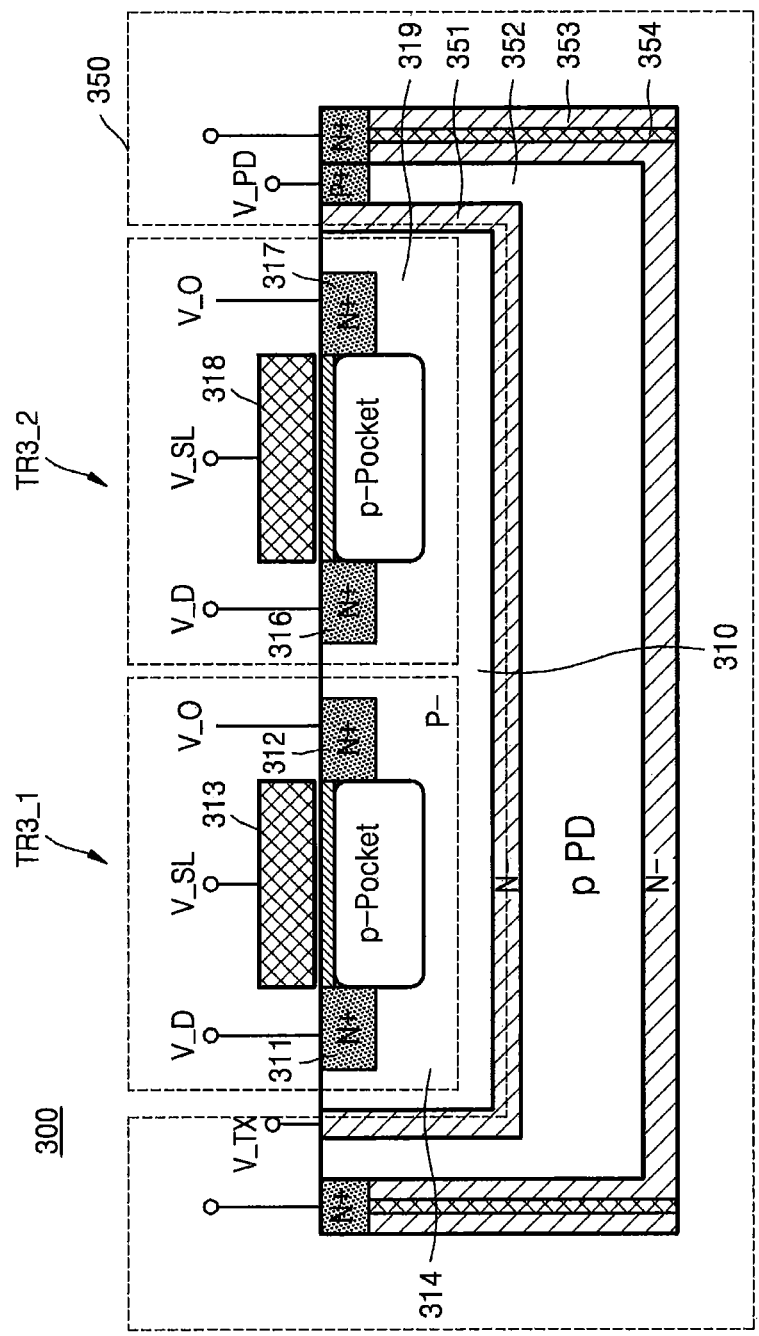
FIG. 6 is a cross-sectional view of a sensing pixel of a time of flight (ToF) image sensor according to an embodiment of the inventive concepts.

FIG. 6 is a cross-sectional view illustrating a sensing pixel 300 of a time of flight (ToF) image sensor according to an embodiment of the inventive concepts.

Referring to FIG. 6, the ToF sensing pixel 300 may include a determination region 310 and an integration region 350.

The determination region 310 may include a first floating body transistor TR3_1 and a second floating body transistor TR3_2. The first floating body transistor TR3_1 includes a drain region 311, a source region 312, a gate electrode 313, and a floating body region 314. The second floating body transistors TR3_2 includes a drain region 316, a source region 317, a gate electrode 318, and a floating body region 319.

The integration region 350 may include a first layer 351, a second layer 352, and a third layer 353. The first and second layers 351 and 352 may be configured similar to the first and second layers 151 and 152 of FIG. 1, respectively.

The third layer 353 of the integration region 350 may be configured identically to the third layer of the integration region 150 of FIG. 1 or the third layer of the integration region 250 of FIG. 5. Thus, as is shown in FIG. 6, in some embodiments, the integration region 350 may include a nonconductive layer as in the integration region 250 of FIG. 5. In other embodiments (not shown), the integration region 350 may not include the nonconductive layer, as in the integration region 150 of FIG. 1.

In the ToF image sensor according to an embodiment of the inventive concepts, the determination region 310 of the sensing pixel 300 may include one or more pairs of floating body transistors, and receive signals having different phases to measure a distance from the image sensor to an object.

In detail, the first and second floating body transistors TR3_1 and TR3_2 may measure a distance to an object by using light signals having different phases which are transmitted from a light source and reflected by the object.

For example, the first floating body transistor TF3_1 that is included in the determination region 310 may sense a light signal having the same phase as that of light emitted from the light source, and the second floating body transistor TF3_2 that is included in the determination region 310 may sense a light signal having a 180-degree phase difference with the light emitted from the light source, thereby measuring a distance to an object. That is, features of the present inventive concepts may be applied to the ToF image sensor.

Figure 7:
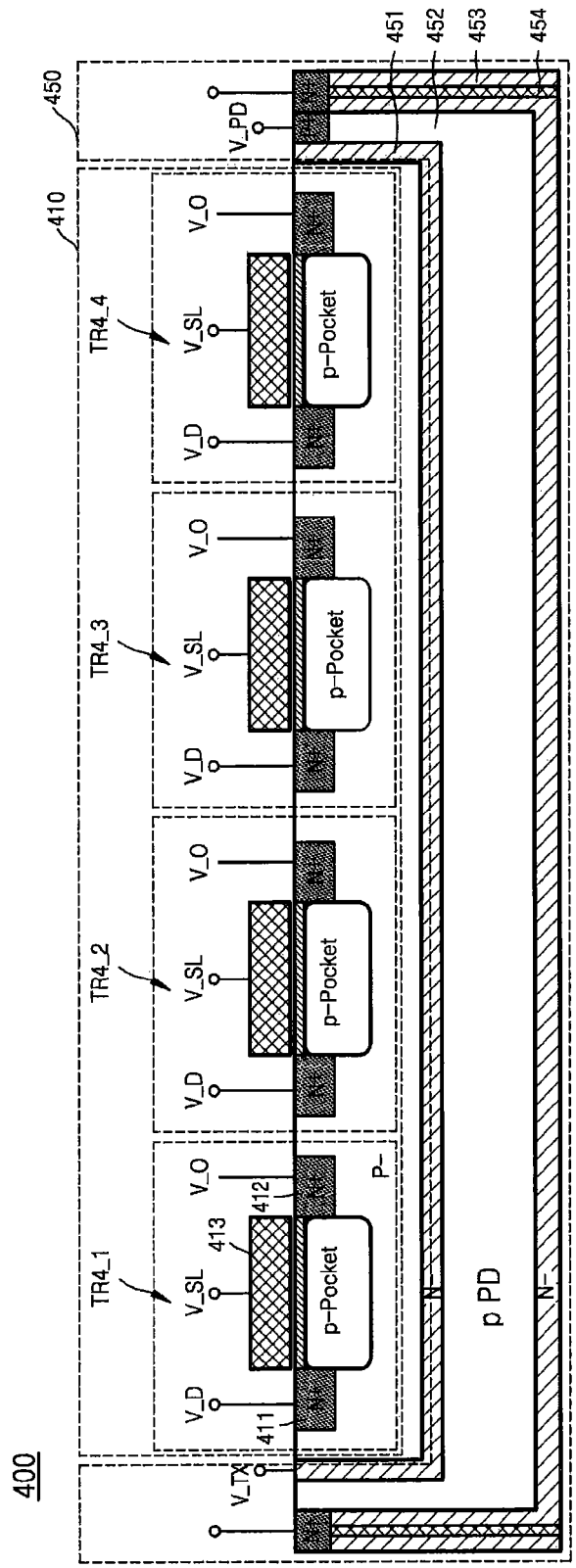
FIG. 7 is a cross-sectional view of a sensing pixel of an image sensor according to an embodiment of the inventive concepts.

FIG. 7 is a cross-sectional view illustrating a sensing pixel 400 of an image sensor according to an embodiment of the inventive concepts.

Referring to FIG. 7, the sensing pixel 400 may include a determination region 410 and an integration region 450.

The determination region 410 may include one or more floating body transistors TR4_1 to TR4_4. Each of the floating body transistors TR4_1 to TR4_4, as in the floating body transistor of FIG. 1, may include a drain region, a source region, a gate electrode, and a floating body region.

The integration region 450 may be configured identically to the integration region 350 of FIG. 6. That is, in some embodiments, the integration region 450 may include a nonconductive layer as in the embodiment of FIG. 5. In other embodiments, the integration region 450 may not include the nonconductive layer as in the integration region 150 of FIG. 1.

The sensing pixel 400 may include a plurality of floating body transistors corresponding to one integration region 450, and thus, the integration region 450 is formed to have a relatively broad area, thereby enhancing a fill factor and sensitivity of the sensing pixel 400 to light.

Figure 8:
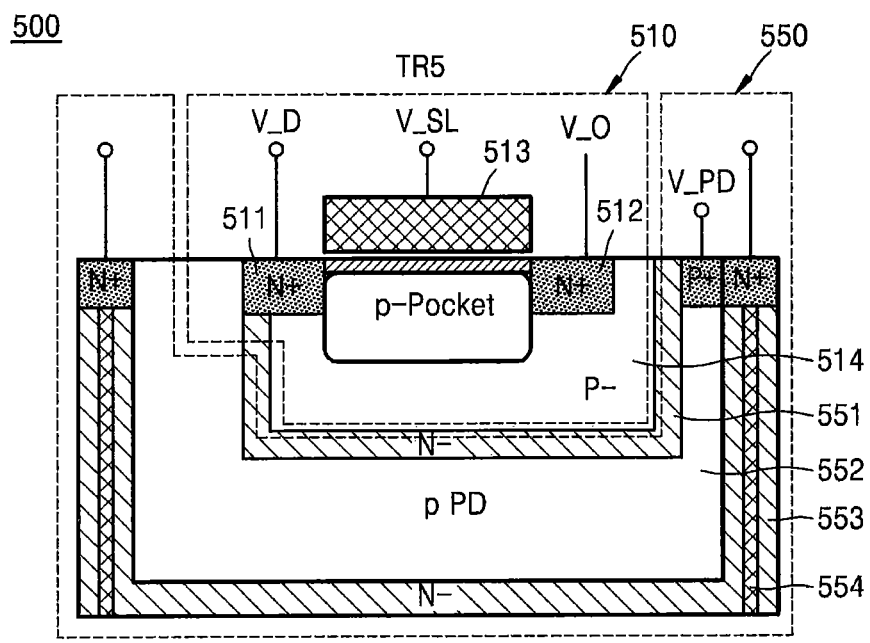
FIG. 8 is a cross-sectional view of a sensing pixel of an image sensor according to an embodiment of the inventive concepts.

FIG. 8 is a cross-sectional view illustrating a sensing pixel 500 of an image sensor according to an embodiment of the inventive concepts.

Referring to FIG. 8, the sensing pixel 500 may include a determination region 510 and an integration region 550.

The determination region 510 may include one or more floating body transistors TR5 that each include a drain region 511, a source region 512, a gate electrode 513, and a floating body region 514.

The integration region 550 may include a first layer 551, a second layer 552, and a third layer 553. The second layer 552 may be similar or identical to the second layer 152 of FIG. 1.

The first layer 551 of the integration region 550 may be adjacent to and electrically connected to the drain region 511 of the floating body transistor TR5. For example, the first layer 551 of the integration region 550 may be connected to a bottom of the drain region 511 of the floating body transistor TR5, and thus, the same voltage may be applied to the first layer 551 and the drain region 511.

In some embodiments, the third layer 553 of the integration region 550, as in FIG. 8, may include a nonconductive layer 554. In other embodiments, the integration region 550 may not include the nonconductive layer as in the integration region 150 of FIG. 1.

The drain region 511, the source region 512, the first layer 551, and the third layer 553 may comprise N-type semiconductors. The floating body region 514 and the second layer 552 may comprise P-type semiconductors.

An operation for reading information in the floating body transistor TR5 will be described with reference to FIG. 8 and Table 2.

TABLE 2

| Voltage (V) | V_D | V_SL | V-TX | V_PD | V_O |
|---|---|---|---|---|---|
| Integration | High | High | High | Floating | High |
| Transfer | Low/Medium | Low | Low/Medium | Floating | Low/Medium |
| Read | High | Medium | High | Floating | Floating |
| Reset | Low/Medium | High | Low/Medium | GND | High |

During the integration operation, a drain voltage V_D, a gate voltage V_SL, and the voltage V_TX applied to the first layer 551, and a source voltage V_O may be set to a logic high level. When light is irradiated onto the integration region 550, electron-hole pairs are generated from light having a certain range of wavelengths. The wavelengths of the light that will generate the electron-hole pairs is set based on a thickness of the second layer 552.

In a transfer operation, the drain voltage V_D, the voltage V_TX applied to the first layer 551, and the source voltage V_O may each be set to a logic low or a logic medium level, and the gate voltage V_SL may be set to a logic low level. Positive holes, which are collected during the integration operation, are moved to an internal pocket p_Pocket of the floating body region 514 by a voltage slope.

In a read operation, the drain voltage V_D and the voltage V_TX applied to the first layer 551 may each be set to a logic high level, and the gate voltage V_SL may be set to a logic medium level. The read operation may determine whether positive holes were moved to the pocket p_Pocket, based on a level of the source voltage V_O.

In a reset operation, the source voltage V_O, and the gate voltage V_SL may be set to a logic high level. The drain voltage V_D and the voltage V_TX applied to the first layer 551 may each be set to a low logic level or a medium logic level. A voltage V_PD applied to the second layer 552 may be grounded. In the reset operation, the floating body region 514 and the integration region 550 are reset, and the image sensor prepares for the next integration operation.

That is, in the sensing pixel 500, since the drain region 511 of the floating body transistor TR5 is electrically connected to the first layer 551 of the integration region 550, a separate electrode that is connected to the first layer 551 of the integration region 550 may not be needed, thereby simplifying the structure and operation of the device.

Figure 9:
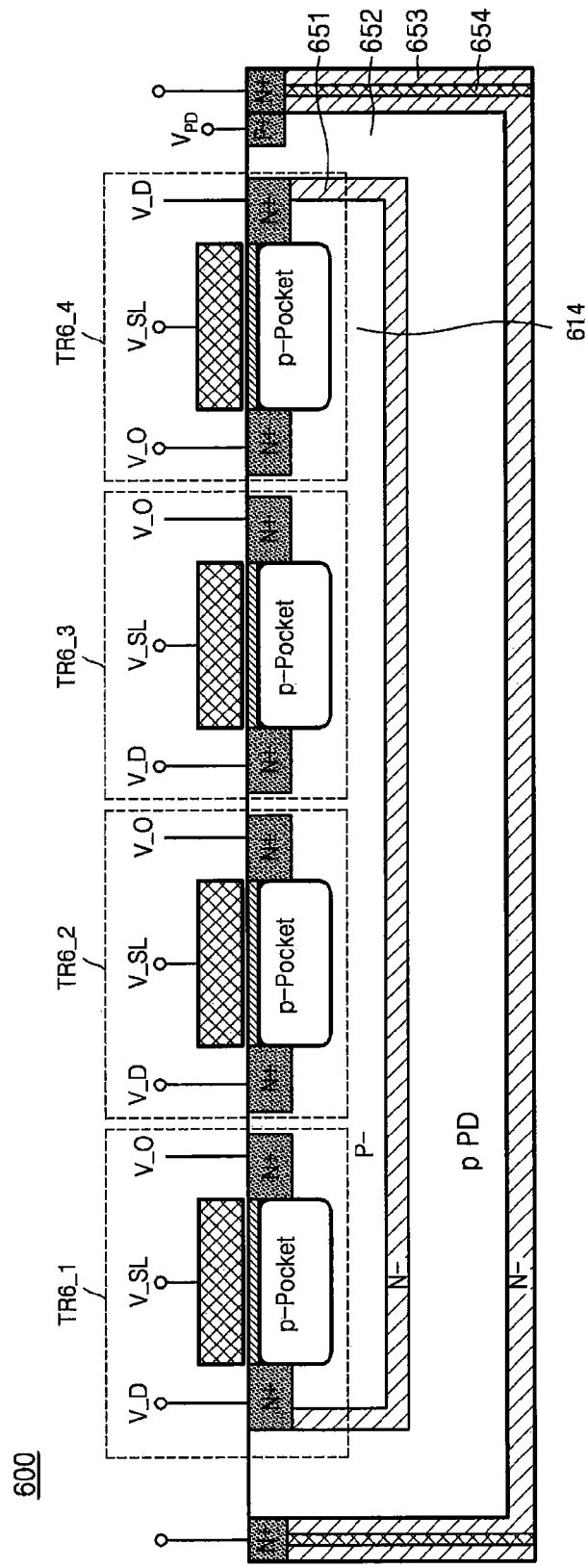
FIG. 9 is a cross-sectional view of a sensing pixel of an image sensor according to an embodiment of the inventive concepts.

Moreover, in a sensing pixel 600 of an image sensor illustrated in FIG. 9, a drain region of each of a plurality of floating body transistors TR6_1 to TR6_4 is electrically connected to a first layer 651 of an integration region, and thus a plurality of floating body transistors TR6_1 through TR6_4 are provided that correspond to a single integration region. Note that while only the electrical connections between transistors TR6_1 and TR6_4 and the first layer 651 are visible in the cross-sectional view of FIG. 9, the drain regions of transistors TR6_2 and TR6_3 may likewise be electrically connected to the first layer 651 outside of the cross-sectional view of FIG. 9. In the embodiment of FIG. 9, the integration region is formed to have a relatively broad area, thereby enhancing a fill factor and sensitivity of the sensing pixel 600 to light.

Figure 10:
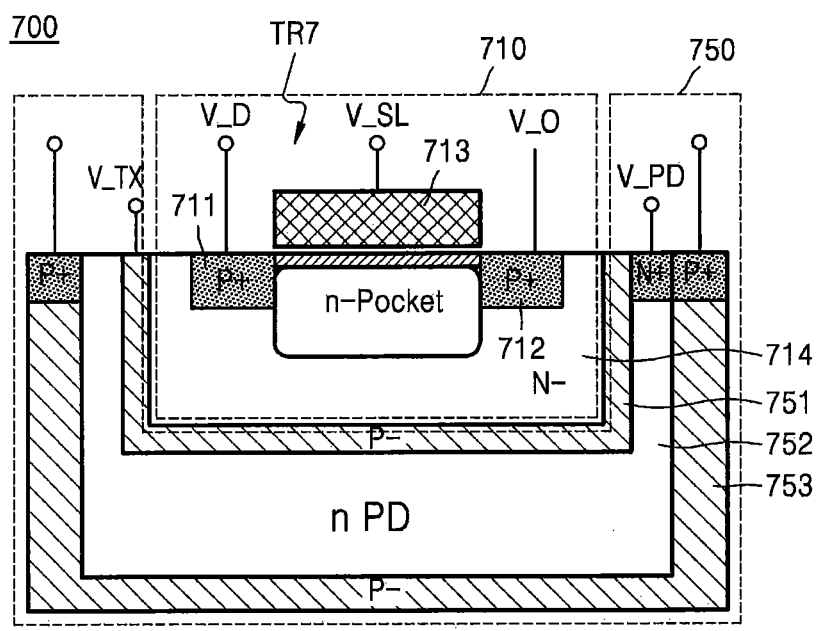
FIG. 10 is a cross-sectional view of a sensing pixel according to an embodiment of the inventive concepts.

FIG. 10 is a cross-sectional view illustrating a sensing pixel 700 according to an embodiment of the inventive concepts.

Referring to FIG. 10, the sensing pixel 700 may include a determination region 710 and an integration region 750.

A drain region 711 and a source region 712 of a floating body transistor TR7 of the determination region 710 may be formed of a P-type semiconductor. A gate electrode 713 and a floating body region 714 of the floating body transistor TR7 may be formed of an N-type semiconductor.

The integration region 750 may include a first layer 751, a second layer 752, and a third layer 753. The first layer 751 may be a P-type semiconductor, and may be adjacent the floating body region 714 of the floating body transistor TR7. The second layer 752 may be an N-type semiconductor, and may be adjacent the first layer 751. The third layer 753 may be a P-type semiconductor, and may be adjacent the second layer 752.

An operation for reading information in the floating body transistor TR7 is similar to the operation for reading information in the floating body transistor TR1, and will be described in detail with reference to Table 3.

TABLE 3

| Voltage (V) | V_D | V_SL | V_TX | V_PD | V_O |
|---|---|---|---|---|---|
| Integration | Low | Low | Low | Floating | Low |
| Transfer | Low | High | Low/Medium | Floating | Low |
| Read | Low | Medium | Low | Floating | Floating |
| Reset | Low | Low | Low/Medium | High | Low |

During an integration operation, a drain voltage V_D, a gate voltage V_SL, a source voltage V_O, and a voltage V_TX that is applied to the first layer 751 may be set to a logic low level. When light is irradiated onto the integration region 750, electron-hole pairs are generated from light having a certain range of wavelengths which may be set based on a thickness of the second layer 752.

In a transfer operation, the drain voltage V_D and the source voltage V_O may be set to a logic low level, the gate voltage V_SL may be set to a logic high level, and the voltage V_TX that is applied to the first layer 751 may be set to a logic low level or a logic medium level. Electrons which are collected in the integration operation are moved to an internal pocket n_Pocket of the floating body region 714 by a voltage slope.

In a read operation, the drain voltage V_D and the voltage V_TX may be set to a logic low level, and the gate voltage V_SL may be set to a logic medium level. Whether the electrons are moved to the pocket n_Pocket may be determined based on a level of the source voltage V_O.

In a reset operation, the drain voltage V_D, the source voltage V_O, and the gate voltage V_SL may be set to a logic low level, and the voltage V_TX applied to the first layer 751 may be set to a logic low level or a logic medium level. A ground voltage may be applied to the second layer 752.

Since the sensing pixel 700 according to an embodiment of the inventive concepts includes the integration region 750 having a PNP junction which absorbs light and the separate determination region 710 which includes a PMOS transistor and determines whether the light is absorbed by sensing whether electrons have been moved, the integration region 750 is formed to have a relatively broad area, thereby enhancing a fill factor and sensitivity of the sensing pixel 700 to light.

Figure 11:
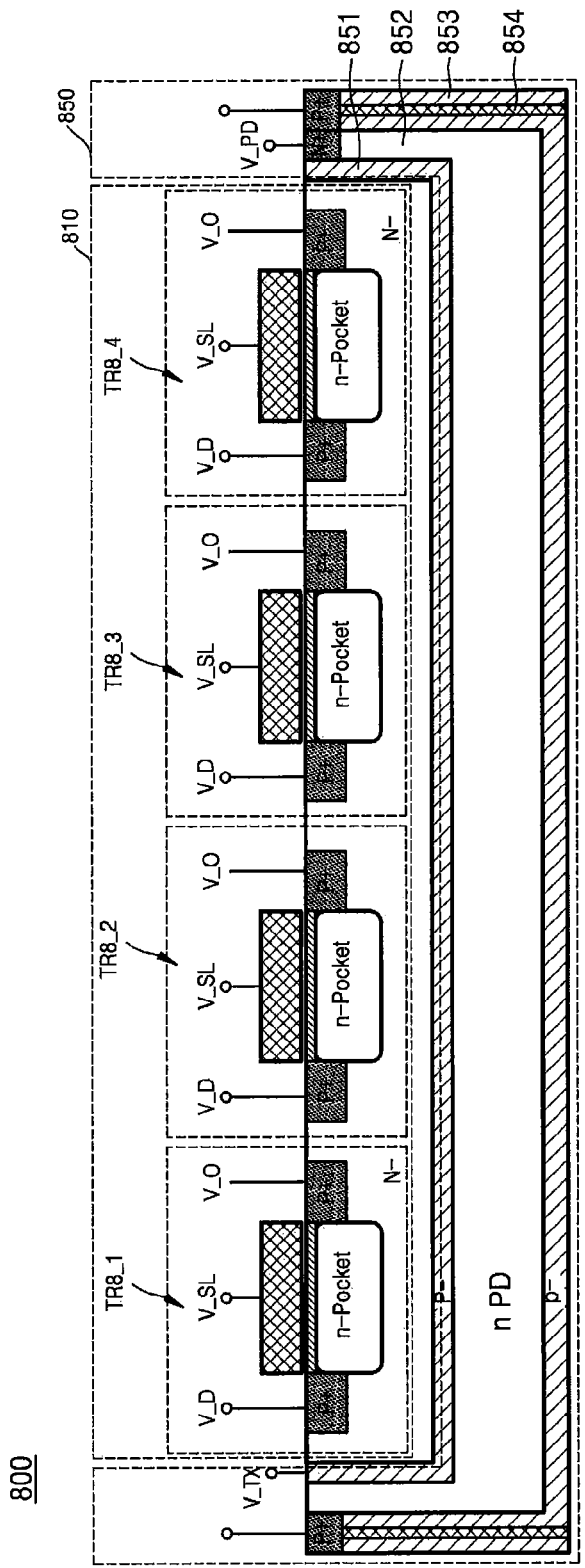
FIG. 11 is a cross-sectional view of a sensing pixel of an image sensor according to an embodiment of the inventive concepts.

FIG. 11 is a cross-sectional view illustrating a structure of a sensing pixel 800 of an image sensor according to an embodiment of the inventive concepts.

Referring to FIG. 11, the sensing pixel 800 may include a determination region 810 and an integration region 850.

The determination region 810, similar to the determination region 410 of FIG. 7, may include a plurality of floating body transistors TR8_1 to TR8_4. Each of the floating body transistors TR8_1 to TR8_4, as illustrated FIG. 11, may be a PMOS transistor. Therefore, the integration region 850 may be formed by a PNP junction of first to third layers 851 to 853.

Figure 12:
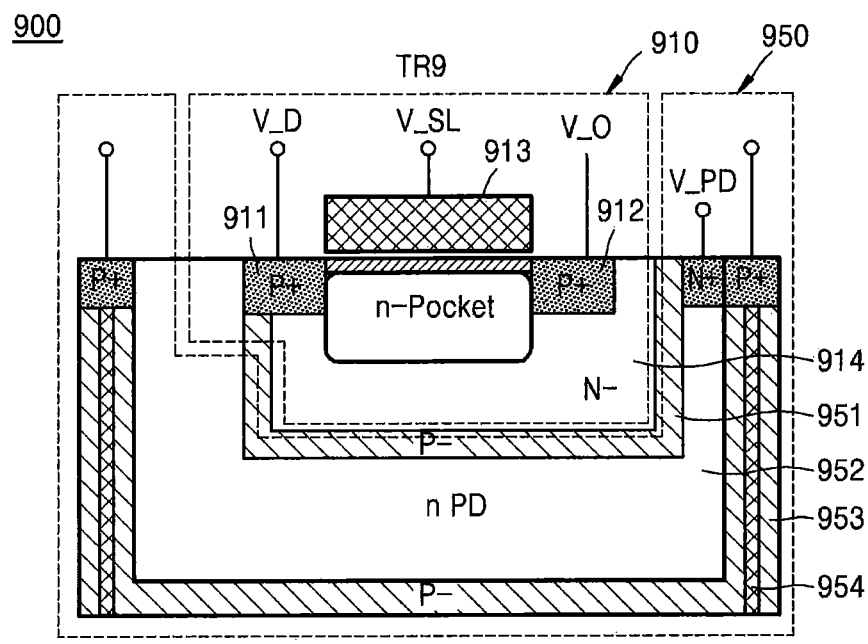
FIG. 12 is a cross-sectional view of a sensing pixel of an image sensor according to an embodiment of the inventive concepts.

FIG. 12 is a cross-sectional view illustrating a sensing pixel 900 of an image sensor according to an embodiment of the inventive concepts.

Referring to FIG. 12, the sensing pixel 900 may include a determination region 910 and an integration region 950.

Similar to the drain region of the floating body transistor TR5 of FIG. 8, a drain region of a floating body transistor TR9 is electrically connected to a first layer 951 of the integration region 950. As illustrated in FIG. 12, the floating body transistor TR9 may be a PMOS transistor. Therefore, the integration region 950 may have a PNP junction.

Similar to the embodiment of FIG. 8, in the sensing pixel 900 of FIG. 12, a drain region 911 of the floating body transistor TR9 is electrically connected to a first layer 951 of the integration region 950, and thus, an electrode connected to the first layer 951 of the integration region 950 is not needed, thereby simplifying the structure and operation of the device.

An operation for reading information in the floating body transistor TR9 now will be described in detail with reference to Table 4.

TABLE 4

| Voltage (V) | V_D | V_SL | V_TX | V_PD | V_O |
|---|---|---|---|---|---|
| Integration | Low | Low | Low | Floating | Low |
| Transfer | Low/Medium | High | Low/Medium | Floating | Low |
| Read | Low | Medium | Low | Floating | Floating |
| Reset | Low/Medium | Low | Low/Medium | High | Low |

Referring to Table 4 and FIG. 12, during an integration operation, a drain voltage V_D, a gate voltage V_SL, a source voltage V_O, and a voltage V_TX that is applied to the first layer 951 may be set to a logic low level. When light is irradiated onto the integration region 950, electron-hole pairs are generated from light having a certain range of wavelengths which may be set based on a thickness of the second layer 952.

In a transfer operation, the source voltage V_O may be set to a logic low level, the gate voltage V_SL may be set to a logic high level, and the drain voltage V_D and the voltage V_TX that is applied to the first layer 951 may be set to a logic low level or a logic medium level. Electrons which are collected in the integration operation are moved to an internal pocket n_Pocket of the floating body region 914 by a voltage slope.

In a read operation, the drain voltage V_D and the voltage V_TX may be set to a logic low level, and the gate voltage V_SL may be set to a logic medium level. Whether the electrons are moved to the pocket n_Pocket may be determined based on a level of the source voltage V_O.

In a reset operation, the source voltage V_O, and the gate voltage V_SL may be set to a logic low level, and the drain voltage V_D and the voltage V_TX applied to the first layer 751 may be set to a logic low level or a logic medium level. A high voltage may be applied to the second layer 952.

Figure 13:
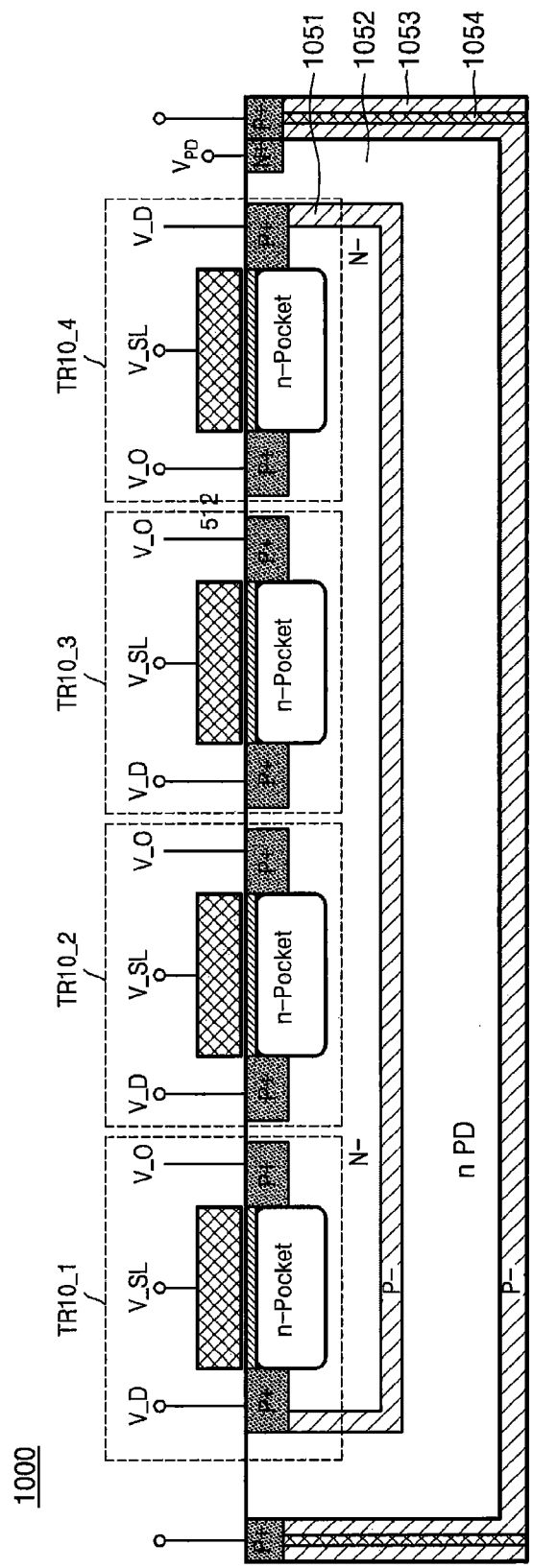
FIG. 13 is a cross-sectional view of a sensing pixel of an image sensor according to an embodiment of the inventive concepts.

In a sensing pixel 1000 of an image sensor illustrated in FIG. 13, a drain region of each of a plurality of floating body transistors TR10_1 to TR10_4 is electrically connected to a first layer 1051 of an integration region, and a plurality of floating body transistors are provided in correspondence with one integration region. Therefore, the integration region 1051 is formed to have a relatively broad area, thereby enhancing a fill factor and a sensitivity of the sensing pixel 1000 to light.

Figure 14:
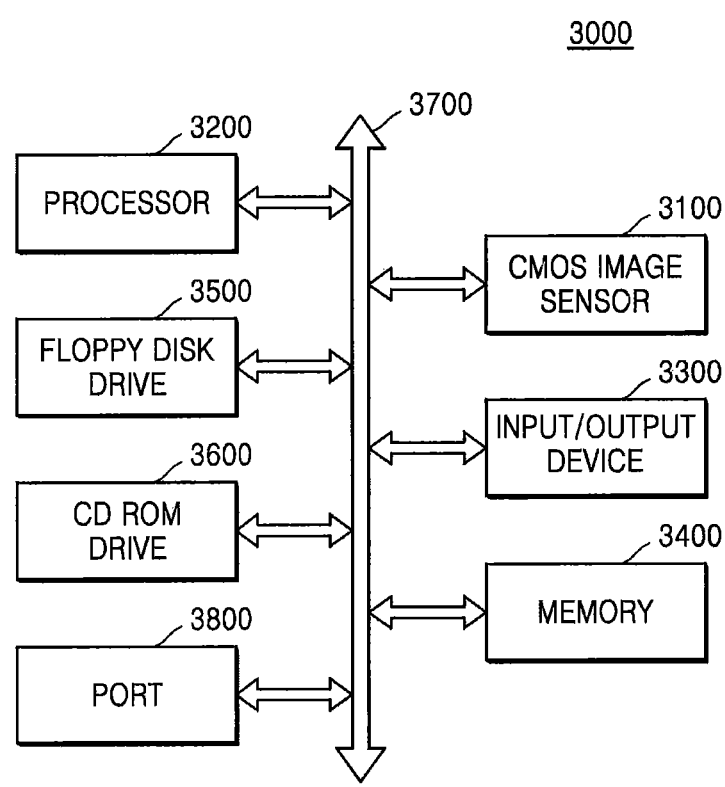
FIG. 14 is a block diagram schematically illustrating an electronic system that includes an image sensor according to embodiments of the inventive concepts.

FIG. 14 is a block diagram schematically illustrating an electronic system 3000 that includes an image sensor according to embodiments of the inventive concepts.

Referring to FIG. 14, the electronic system 3000 includes a CMOS image sensor 3100, a processor 3200, an input/output device 3300, a memory 3400, a floppy disk drive 3500, and a compact disk (CD) read-only memory (ROM) drive 3600. The elements may be connected to each other through a bus 3700. The electronic system 3000 processes an output image of the CMOS image sensor 3100.

The CMOS image sensor 3100 may include an image sensor that includes at least one of the sensing pixels 100 to 1000 according to the embodiments of the inventive concepts described above with reference to FIGS. 1 to 13.

The electronic system 3000 may be a portable communication terminal, a computer system, a camera system, a scanner, an image stabilization system, or the like. The CMOS image sensor 3100 may receive a control signal or data from the processor 3200 or another element of the electronic system 3000. The CMOS image sensor 3100 may supply a signal, which defines an image, to the processor 3200 on the basis of the received control signal or data. The processor 3200 may process a signal received from the CMOS image sensor 3100.

The processor 3200 may execute a program, and control the electronic system 3000. In some embodiments, the processor 3200 may be a microprocessor, a digital signal processor, a microcontroller, or a device similar thereto.

The input/output device 3300 may be used to input/output data of the electronic system 3000. The electronic system 3000 may be connected to an external device (for example, a personal computer (PC) or a network) via the input/output device 3300, and may exchange data with the external device. The input/output device 3300 may be, for example, a keypad, a keyboard, or a display device.

The memory 3400 may store a code and/or data which are/is used to operate the processor 3200, or store data that is output by the processor 3200. A port 3800 may be connected to a video card, a sound card, a memory card, and a universal serial bus (USB) device, or may communicate with another system.

Figure 15:
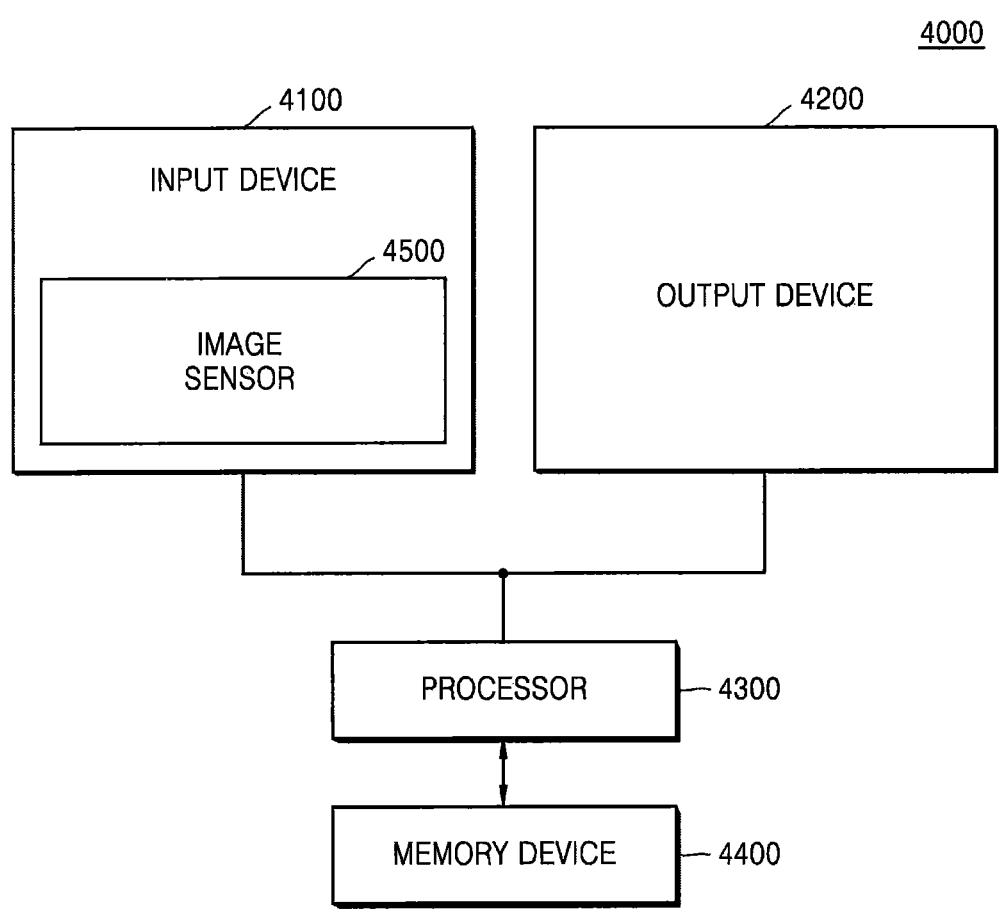
FIG. 15 is a block diagram illustrating an electronic system that includes an image sensor according to embodiments of the inventive concepts.

FIG. 15 is a block diagram illustrating an application example of an electronic system 4000 that includes an image sensor according to embodiments of the inventive concepts.

Referring to FIG. 15, the electronic system 4000 may include an input device 4100, an output device 4200, a processor 4300, and a memory device 4400. The processor 4300 may control the input device 4100, the output device 4200, and the memory device 4400 through a corresponding interface.

The electronic system 4000 may further include a port (not shown) that communicates with a video card, a sound card, a memory card, a USB device, or communicates with another system. For example, the electronic system 4000 may be a computer system, a camera system, a scanner, a vehicle navigation device, a video phone, a monitoring system, an automatic focus system, a trace system, an operation monitoring system, an image stabilization system, or another image sensor.

The input device 4100 may include an image sensor 4500 that includes at least one of the sensing pixels 100 to 1000 according to the embodiments of the inventive concepts described above with reference to FIGS. 1 to 13. In other embodiments, the image sensor 4500 may instead be integrated with the processor 4300 or the memory device 4400. The image sensor 4500 may communicate with the processor 4300 through a communication link.

The processor 4300 may include at least one of a microprocessor, a digital signal processor, a microcontroller, and a logic device performing a function similar thereto. The input device 4100 and the output device 4200 may include at least one device that inputs/outputs data.

Figure 16:
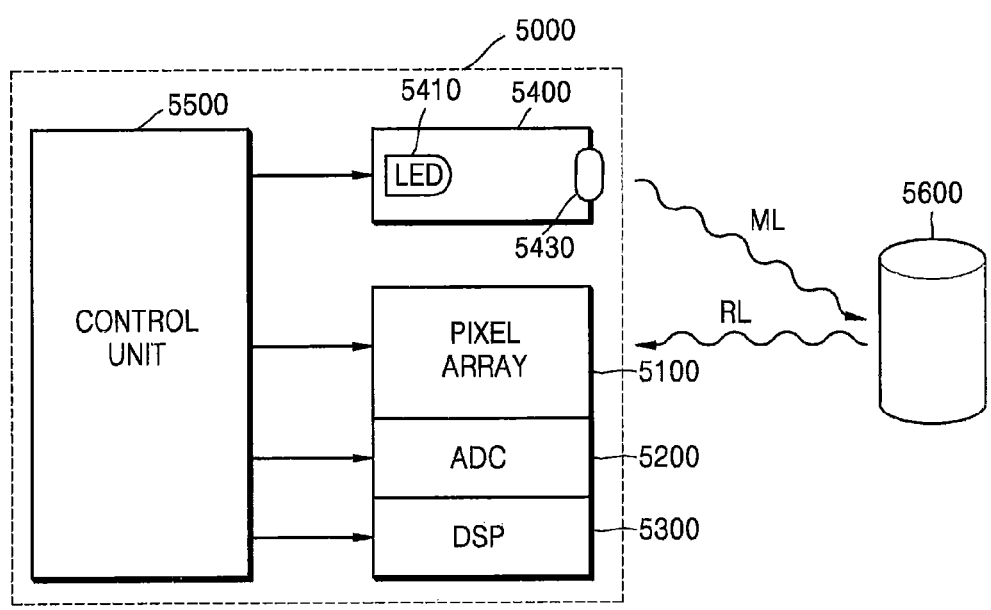
FIG. 16 is a block diagram illustrating an image sensor including a sensing pixel according to embodiments of the inventive concepts.

FIG. 16 is a block diagram illustrating an image sensor 5000 including a sensing pixel according to embodiments of the inventive concepts.

Referring to FIG. 16, the image sensor 5000 includes a pixel array 5100, an analog-to-digital conversion (ADC) unit 5200, a digital signal processing (DSP) unit 5300, a light source module 5400, and a control unit 5500.

The pixel array 5100 includes a plurality of color pixels, which generate color image information, and a plurality of sensing pixels that generate distance information. That is, the image sensor 5000 may be a three-dimensional (3D) image sensor that generates both color image information and distance information.

Each of the sensing pixels may be, for example, the sensing pixel 300 described above with reference to FIG. 6. Therefore, a plurality of color photodiodes efficiently absorb infrared light (or near-infrared light), thereby enhancing a quantum efficiency of the sensing pixels.

The ADC unit 5200 may convert an analog signal, which is output from the pixel array 5100, into a digital signal. According to an embodiment, the ADC unit 5200 may perform a column ADC operation that converts analog signals in parallel using an analog-to-digital converter connected to each column line, or perform a single ADC operation that sequentially converts the analog signals using a single analog-to-digital converter.

According to an embodiment, the ADC unit 5200 may include a correlated double sampling (CDS) unit that extracts an effective signal component. In an embodiment, the CDS unit may perform an analog double sampling operation that extracts the effective signal component on the basis of a difference between an analog reset signal indicating a reset component and an analog data signal indicating a signal component. In another embodiment, the CDS unit may be a digital double sampling operation that respectively converts the analog reset signal and the analog data signal into digital signals, and extracts a difference between the two digital signals as the effective signal component. In another embodiment, the CDS unit may perform a dual correlated double sampling operation that performs both the analog double sampling operation and the digital double sampling operation.

The DSP unit 5300 may receive a digital image signal output from the ADC unit 5200, and perform image data processing for the digital image signal. For example, the DSP unit 5300 may perform image interpolation, color correction, white balance, gamma correction, and/or color conversion. In FIG. 16, an example in which the DSP unit 5300 is included in the image sensor 5000 is illustrated, but the inventive concepts are not limited thereto. According to another embodiment, the DSP unit 5300 may be external to the image sensor 5000.

The light source module may emit modulated light ML having a certain wavelength (for example, infrared light or near-infrared light). The light source module 5400 may include a light source 5410 and a lens 5430. The light source 5410 may output the modulated light ML which is obtained through modulation by the control unit 5500 in order for the intensity to be periodically changed. The modulated light ML emitted from the light source module 5400 may be reflected from an object 5600, and may be incident onto the pixel array 5100 as received light RL. A plurality of pixels included in the pixel array 5100 may provide distance information on the basis of the received light RL.

For example, an intensity of the modulated light ML may be modulated in order for the modulated light ML to have waves such as pulse waves, sine waves, or cosine waves, which have continuous pulses. According to an embodiment, the light source 5410 may be configured using a light-emitting diode (LED) or a laser diode. The lens 5430 may focus the modulated light ML that is emitted from the light source 5410 onto the object 5600. According to an embodiment, the lens 5430 may adjust a diffusion angle of the modulated light ML. For example, an interval between the light source 5410 and the lens 5430 may be controlled by the control unit 5500, and thus, the diffusion angle of the modulated light ML may be adjusted.

The control unit 5500 may control the pixel array 5100, the ADC unit 5200, the DSP unit 5300, and the light source module 5400. The control unit 5500 may supply control signals such as a clock signal, a timing control signal, etc. which are used to operate the pixel array 5100, the ADC unit 5200, the DSP unit 5300, and the light source module 5400. In an embodiment, the control unit 5500 may include a logic control circuit, a phase lock loop (PLL) circuit, a timing control signal, and/or a communication interface circuit.

While the inventive concepts have been particularly shown and described with reference to exemplary embodiments thereof, it will be understood that various changes in form and details may be made therein without departing from the spirit and scope of the inventive concepts as set forth in the following claims.

What is claimed is:

1. A sensing pixel comprising:
a determination region that includes a floating body transistor that has a floating body region; and
an integration region that is adjacent the floating body region of the floating body transistor, where the integration region and the floating body region are physically distinct semiconductor regions of the sensing pixel, the integration region configured to generate electron-hole pairs that each comprise an electron and a hole in response to light received by the integration region, and to transfer at least some of the electrons or holes to the floating body region of the floating body transistor in response lied to the determination region and the integration region,
wherein the sensing pixel is configured to determine whether charges are present within the determination region during a read operation.

2. The sensing pixel of claim 1, wherein the integration region comprises:
a first layer that comprises a semiconductor having a first conductivity type, the first layer being adjacent the floating body region of the floating body transistor;
a second layer that comprises a semiconductor having a second conductivity type that is opposite the first conductivity type, the second layer being adjacent the first layer; and
a third layer that comprises the semiconductor having the first conductivity type, the third layer adjacent the second layer,
wherein the second layer is between the first layer and the third layer, and
wherein the first layer is between the second layer and the floating body region.

3. The sensing pixel of claim 2, wherein the first layer is electrically connected to a drain region of the floating body transistor.

4. The sensing pixel of claim 2, wherein the third layer includes a first section that extends underneath the floating body region of the floating body transistor and a second section that is perpendicular to the first section, wherein the second section includes a nonconductive layer.

5. The sensing pixel of claim 1, wherein,
the floating body transistor is a PMOS transistor, and the integration region comprises a PNP junction, or
the floating body transistor is an NMOS transistor, and the integration region comprises a NPN junction.

6. The sensing pixel of claim 1, wherein the integration region is configured to generate the electron-hole pairs in response to light having one of a first color, a second color, or a third color based on a thickness of the integration region.

7. The sensing pixel of claim 1, wherein the floating body transistor comprises a first floating body transistor and the determination region includes a second floating body transistor that has a floating body region that is configured to receive additional of the electrons or holes from the integration region.

8. The sensing pixel of claim 1, wherein the sensing pixel is configured to absorb light in the integration region, change a voltage applied to a gate of the floating body transistor, and transfer the at least some of the electrons or holes that are generated in the integration region to the floating body transistor.

9. The sensing pixel of claim 8, wherein the sensing pixel is configured to absorb light in the integration region, change a voltage applied to a first layer of the integration region that is adjacent the floating body transistor, and transfer the at least some of the electrons or holes that are generated in the integration region to the floating body transistor.

10. An image sensor comprising:
a sensing pixel array that comprises a plurality of sensing pixels that are arranged in rows;
a row decoder that is configured to generate drive signals that drive the rows of the sensing pixel array;
an image processor that is configured to generate a color image from pixel signals which are output from the sensing pixel array; and
a timing generation circuit that is configured to supply a timing signal and a control signal to the row decoder and the image processor,
wherein each of the plurality of sensing pixels comprises:
a determination region that includes a floating body transistor; and
an integration region that is adjacent a floating body region of the floating body transistor, where the integration region and the floating body region are physically distinct semiconductor regions of the sensing pixel, the integration region configured to generate electron-hole pairs that each comprise an electron and a hole in response to light received by the integration region and to transfer at least some of the electrons or holes to the floating body region of the floating body transistor in response to voltages applied to the determination region and the integration region, wherein the sensing pixel is configured to determine whether charges are present within the determination region during a read operation.

11. The image sensor of claim 10, wherein the integration region for a first of the sensing pixels has a first thickness that is configured to pass light of a first color, the integration region for a second of the sensing pixels has a second thickness that is configured to pass light of a second color, and the integration region for a third of the sensing pixels has a third thickness that is configured to pass light of a third color.

12. The image sensor of claim 10, wherein the integration region for a first of the sensing pixels comprises:
a first semiconductor layer having a first conductivity type that is adjacent the floating body region of the floating body transistor;
a second semiconductor layer having a second conductivity type that is opposite the first conductivity type, the second semiconductor layer being adjacent the first semiconductor layer; and
a third semiconductor layer having the first conductivity type that is adjacent the second semiconductor layer.

13. The image sensor of claim 12, wherein the first layer is electrically connected to a drain region of the floating body transistor.

14. The image sensor of claim 10, wherein a first of the sensing pixels is configured to absorb light in the integration region, change a voltage applied to a gate of the floating body transistor, and transfer the electrons or holes that are generated in the integration region to the floating body transistor.

15. The image sensor of claim 10, for a first of the sensing pixels,
the floating body transistor is a PMOS transistor, and the integration region comprises a PNP junction, or the floating body transistor is an NMOS transistor, and the integration region comprises a NPN junction.

16. A sensing pixel for a sensing pixel array of an image sensor, the sensing pixel comprising:
a floating body transistor that has a source region, a drain region, a gate electrode and a floating body region; and
an integration region that is adjacent the floating body region of the floating body transistor, where the integration region and the floating body region are physically distinct semiconductor regions of the sensing pixel, the integration region including a first semiconductor layer having a first conductivity type, a second semiconductor layer having a second conductivity type that is opposite the first conductivity type, and a third semiconductor layer having the first conductivity type, wherein the first semiconductor layer is between the floating body region and the second semiconductor layer, and wherein the second semiconductor layer is between the first and third semiconductor layers.

17. The sensing pixel of claim 16, in combination with circuitry that is configured to apply voltage signals to the source region, the drain region, the gate electrode and the first semiconductor layer of the integration region that are selected to transfer charges that are generated by incident light in the integration region into the floating body region of the floating body transistor.

18. The sensing pixel of claim 17, wherein the first semiconductor layer is electrically connected to the drain region of the floating body transistor so that the same voltage signal is applied to the drain region and to the first semiconductor layer.

19. The sensing pixel of claim 16, wherein the third semiconductor layer includes a non-conductive section.

20. The sensing pixel of claim 16, wherein the integration region is underneath a bottom surface of the floating body region and surrounds first and second sidewalls of the floating body region, and wherein the floating body region comprises a semiconductor region having the second conductivity type.

* * * * *